(12) United States Patent
Takai et al.

(10) Patent No.: US 8,003,444 B2
(45) Date of Patent: Aug. 23, 2011

(54) SEMICONDUCTOR DEVICE AND MANUFACTURING METHOD THEREOF

(75) Inventors: Keiji Takai, Fukuoka (JP); Tetsuyuki Hirashima, Fukuoka (JP)

(73) Assignee: Mitsui High-Tec, Inc. (JP)

( * ) Notice: Subject to any disclaimer, the term of this patent is extended or adjusted under 35 U.S.C. 154(b) by 371 days.

(21) Appl. No.: 11/501,325

(22) Filed: Aug. 9, 2006

(65) Prior Publication Data
US 2007/0181983 A1    Aug. 9, 2007

(30) Foreign Application Priority Data

Aug. 10, 2005  (JP) .............................. P. 2005-232428
Aug. 10, 2005  (JP) .............................. P. 2005-232452

(51) Int. Cl.
*H01L 21/00* (2006.01)
(52) U.S. Cl. ................. 438/123; 438/689; 257/E21.499
(58) Field of Classification Search .................. 438/111, 438/123, 689, 617; 257/778
See application file for complete search history.

(56) References Cited

U.S. PATENT DOCUMENTS

| | | | |
|---|---|---|---|
| 4,585,528 A * | 4/1986 | Matsumoto | 205/125 |
| 5,548,890 A * | 8/1996 | Tada et al. | 29/827 |
| 6,238,952 B1 * | 5/2001 | Lin | 438/110 |
| 6,451,627 B1 | 9/2002 | Coffman | |
| 6,551,859 B1 | 4/2003 | Lee et al. | |
| 2006/0022316 A1 * | 2/2006 | Huang et al. | 257/676 |

FOREIGN PATENT DOCUMENTS

| | | |
|---|---|---|
| JP | 59 208756 A | 11/1984 |
| JP | 61-285742 | 12/1986 |
| JP | 4-212443 | 8/1992 |
| JP | 7-231062 | 8/1995 |
| JP | 8-255864 | 10/1996 |
| JP | A-2001-24135 | 1/2001 |
| JP | 2001-156239 | 6/2001 |
| JP | 2005-57162 | 3/2005 |
| JP | 2005-89820 | 4/2005 |

* cited by examiner

*Primary Examiner* — Chuong A Luu
*Assistant Examiner* — Nga Doan
(74) *Attorney, Agent, or Firm* — Wood, Phillips, Katz, Clark & Mortimer

(57) ABSTRACT

A method of manufacturing a semiconductor device 28 in which a plating mask 38, 39 having a noble metal plating layer 35 as an uppermost layer is formed at a predetermined portion on an obverse surface side or a reverse surface side of a leadframe material 10, and the leadframe material 10 is consecutively subjected to etching by using the plating mask 38, 39 as a resist mask, so as to form external connection terminal portions 22 which electrically communicate with a semiconductor element 18 disposed in an interior of an encapsulating resin 21, and which project downwardly. Base metal plating or noble metal plating 33 exhibiting etching solution resistance is provided as a lowermost layer of the plating mask 38, 39.

16 Claims, 8 Drawing Sheets

SECOND ETCHING
(HALF ETCHING)

Cu MATERIAL

COATING OF RESIST, EXPOSURE

DEVELOPMENT

ALL-OVER PLATING

LOWER SURFACE RESIST

FIRST ETCHING (HALF ETCHING)

PEELING OFF OF LOWER SURFACE RESIST

ASSEMBLY (DIE BONDING, WIRE BONDING, MOLDING)

SECOND ETCHING (HALF ETCHING)

DISCRETIZATION

SEMICONDUCTOR DEVICE AND MANUFACTURING METHOD THEREOF

BACKGROUND OF THE INVENTION

The present invention relates to a semiconductor device of a chip size package type (hereinafter called as "CSP type"), and more particularly to a semiconductor device in which external connection terminal portions project from a bottom surface side of an encapsulating resin as well as a method of manufacturing the same.

Tape CSP type semiconductor devices using polyimide resin tape and solder balls and bump chip carrier type (hereinafter called as "BCC type") semiconductor devices using a base metal are known, reflecting demands for the miniaturization of semiconductor devices. However, the tape CSP type semiconductor devices have problems in that the polyimide resin tape is expensive, and that the polyimide resin tape is not suitable for strip transport since it is soft. Meanwhile, the BCC type semiconductor devices have a problem in that after the base metal is removed by etching, discrete devices are left, so that their molded surfaces need to be fixed by pressure sensitive adhesive tape, resulting in high cost. Accordingly, the present assignee earlier proposed a method of manufacturing a semiconductor device disclosed in patent document 1.

An example of this method of manufacturing a semi-conductor device is shown generally in FIGS. 7A to 7J. However, as explained below, certain of the steps shown in FIGS. 7A-7J were not practiced in the noted prior art. As further explained below, certain component compositions were not used in the prior art. After a resist film 11 is coated on the overall obverse and reverse surfaces of a leadframe material 10 constituted of Cu, a Cu alloy, or an iron-nickel alloy (e.g., 42 alloy), the resist film 11 is exposed with a predetermined lead pattern, and development is then carried out, thereby forming an etching pattern 12 of the plating mask. Then, the leadframe material 10 is subjected to all-over plating, and if the resist film 11 is removed, plating masks 13 and 14 are formed on the obverse and reverse sides (steps A to D).

Next, after the entire lower surface (i.e., the reverse surface side) is coated with another resist film 15, in a manner not performed in the noted prior art, the upper surface side (i.e., the obverse surface side) is subjected to half etching by using the plating mask 13 as a resist mask. In this case, since that portion of the surface of the leadframe material 10 which is covered by the plating mask 13 is not etched, an element mounting portion 16 and wire bonding portions 17 formed in advance by the resist film ultimately project. It should be noted that the surfaces of the element mounting portion 16 and the wire bonding portions 17 are covered by the plating mask 13 (steps E and F).

Next, after removing the resist film 15 on the lower surface side, a semiconductor element 18 is mounted on the element mounting portion 16, and electrode pad portions of the semiconductor element 18 and the wire bonding portions 17 are wire bonded, the semiconductor element 18, bonding wires 20, and the wire bonding portions 17 are resin encapsulated. Reference numeral 21 denotes an encapsulating resin (steps F and H).

Subsequently, the reverse surface side is subjected to half etching. At this time, the portion of the leadframe material 10 where the plating mask 14 is formed remains without being etched since the plating mask 14 acts as a resist mask. As a result, reverse surfaces of external connection terminal portions 22 and the element mounting portion 16 project. Since the external connection terminal portions 22 and the wire bonding portions 17 communicate with each other, the respective external connection terminal portions 22 (and the wire bonding portions 17 communicating therewith) are made independent and are electrically connected to the respective electrode pad portions of the semiconductor element 18. Since these semiconductor devices 23 are generally arranged in grid form and are manufactured simultaneously, they are diced and separated (discretized), thereby manufacturing individual semiconductor devices 23 (steps I and J).

[Patent Document 1] JP-A-2001-24135

However, with the above-described semiconductor devices, the corresponding plating masks 13' and 14' are conventionally formed, as shown in FIG. 8. Namely, the plating masks 13' and 14' are formed by providing, for instance, an Ni undercoat 24' with a thickness of 1 µm on the surfaces (including the reverse surface) of the leadframe material 10', and by further providing thereon noble metal plating (e.g., Au) 25' with a thickness of approx. 0.2 µm. Since the noble metal plating 25' on the upper layer side (a layer farther from the leadframe material 10' is referred to as the upper layer, and a layer close thereto is referred to as the lower layer) has etching solution resistance, the noble metal plating 25' is not eroded during etching, but the leadframe material 10' formed of copper or a copper alloy and the Ni undercoat 24' on the lower layer side are eroded by an etching solution, as shown in FIG. 9A. Hence, the periphery of the noble metal plating 25' assumes a foil-like shape, and is adhered to the periphery of each of the wire bonding portions 17', the element mounting portion 16', and the external connection terminal portions 22', thereby forming plating burrs (plating foils) 26'.

If such plating burrs 26' are present, the plating burrs 26' are exfoliated in the wire bonding process, the resin encapsulating process (i.e., molding process), and the like, causing defects in semiconductor devices including faulty wire bonding, and short-circuiting between terminals, and the like.

SUMMARY OF THE INVENTION

The prevent invention has been devised in view of the above-described circumstances, and its object is to provide a method of manufacturing a semiconductor device which yields a small number of defectives by suppressing or eliminating the generation of plating burrs, as well as a semiconductor device manufactured by the same.

In accordance with a first aspect of the invention, there is provided a method of manufacturing a semiconductor device in which a plating mask having a noble metal plating layer as an uppermost layer is formed at a predetermined portion on an obverse surface side or a reverse surface side of a leadframe material, and the leadframe material is consecutively subjected to etching by using the plating mask as a resist mask, so as to form external connection terminal portions which electrically communicate with a semiconductor element disposed in an interior of an encapsulating resin, and which project downwardly, comprising the step of: providing base metal plating or noble metal plating exhibiting etching solution resistance as a lowermost layer of the plating mask.

In the invention, the plating of the lowermost layer of the plating mask refers to a plating layer which is in direct contact with the obverse surface (or reverse surface) of the leadframe material, and the plating of the uppermost layer refers to a plating layer which is on a farthest side from the leadframe material.

In addition, in the method of manufacturing a semiconductor device in accordance with the invention, the thickness of the plating mask is preferably large at, for example, 1 to 10

μm. In this case, in a case where a plating layer (e.g., Ni plating layer) or the like which is easily eroded by an etching solution is disposed in an intermediate portion, since this plating layer is eroded by the etching solution, the thickness of this plating layer is preferably set to 9/10 or less (preferably 4/5) of the total thickness. In addition, since tin plating is difficult to be eroded by the etching solution, tin plating can be used instead of the noble gold plating layer in the lowermost layer (the same applies to ensuing aspects of the invention).

In addition, in the invention (in the first to fifth aspects of the invention), the base metal plating exhibiting etching solution resistance refers to, for example, tin plating, tin-bismuth plating, leaded solder plating, lead-free solder plating, or the like.

In accordance with a second aspect of the invention, there is provided a method of manufacturing a semiconductor device, comprising: a first step of forming a plating mask having a noble metal plating layer as an uppermost layer on wire bonding portions formed around a periphery of a semiconductor element portion on an obverse surface side of a leadframe material and on external connection terminal portions formed on a reverse surface side of the leadframe material in correspondence with the wire bonding portions; a second step of performing etching treatment of a predetermined depth on the leadframe material from the obverse surface side by using as a resist mask the plating mask formed on the obverse surface side after the formation of the etching resist film on the reverse surface side of the leadframe material, so as to cause the wire bonding portions to project; a third step of connecting electrode pad portions of a semiconductor element and the wire bonding portions respectively corresponding thereto by a bonding wire after the semiconductor element is mounted on the leadframe material, to thereby form electrically conductive circuits; a fourth step of encapsulating the obverse surface side of the leadframe material including the semiconductor element, the bonding wire, and the wire bonding portions; and a fifth step of performing etching treatment on the reverse surface side of the leadframe material with the etching resist film removed by using the formed plating mask as a resist mask, so as to cause the external connection terminal portions to project and to be made independent, wherein base metal plating or noble metal plating exhibiting etching solution resistance is provided as a lowermost layer of the plating mask.

It should be noted that the etching resist film formed on the reverse surface side of the leadframe material may be one with a tape material adhered thereto, and may be removed by being peeled off after etching.

In addition, in the method of manufacturing a semiconductor device according to the first or second aspect of the invention, an element mounting portion may be formed in a center of the leadframe material independently of the external connection terminal portions. Furthermore, in this method of manufacturing a semiconductor device, a terminal for heat dissipation may be provided immediately below the semiconductor element.

In accordance with a third aspect of the invention, there is provided a method of manufacturing a semiconductor device, comprising: a first step of forming a plating mask whose uppermost portion is constituted by a noble metal plating layer, the plating mask being formed on obverse and reverse sides of a leadframe material at positions corresponding to electrode pad portions disposed on a lower portion of a semiconductor element mounted on an obverse surface side of the leadframe material; a second step of performing etching treatment of a predetermined depth on the leadframe material from the obverse surface side by using as a resist mask the plating mask formed on the obverse surface side after the formation of an etching resist film on a reverse surface side of the leadframe material, so as to cause internal connection terminal portions for electrically connecting to the electrode pad portions to project; a third step of resin encapsulating the obverse surface side of the leadframe material including the semiconductor element after establishing electric conduction between the semiconductor element and the internal connection terminal portions on mounting the semiconductor element on the leadframe material; and a fourth step of performing etching treatment on the reverse surface side of the leadframe material with the etching resist film removed by using the formed plating mask as a resist mask, so as to cause the external connection terminal portions integrated and communicating with the internal connection terminal portions to project and to be made independent, wherein base metal plating or noble metal plating exhibiting etching solution resistance is provided as a lowermost layer of the plating mask.

It should be noted that the etching resist film formed on the reverse surface side of the leadframe material may be one with a tape material adhered thereto, and may be removed by being peeled off after etching.

A semiconductor device in accordance with a fourth aspect of the invention is manufactured by the method of manufacturing a semiconductor device according to any one of the first to third aspects of the invention.

In accordance with a fifth aspect of the invention, there is provided a semiconductor device having external connection terminal portions which are electrically connected to an encapsulated semiconductor element and project to a reverse surface side, comprising: connection terminal portions (including wire bonding portions and internal connection terminal portions which are brought into direct contact with the semiconductor element) which are electrically connected to electrode pad portions of the semiconductor element, wherein the connection terminal portions and the external connection terminal portions have their uppermost layers each constituted by a noble metal plating layer and their lowermost layers each constituted by base metal plating or noble metal plating exhibiting etching solution resistance.

In accordance with the fifth aspect of the invention, there is also provided a method of manufacturing a semiconductor device, comprising: a first step of forming a plating mask having a noble metal plating layer as an uppermost layer on internal connection terminal portions which are electrically connected to electrode pad portions of a semiconductor element mounted on an obverse surface side of a leadframe material and on external connection terminal portions formed on a reverse surface side of the leadframe material in correspondence with the internal connection terminal portions; a second step of performing etching treatment of a predetermined depth on the leadframe material from the obverse surface side by using as a resist mask the plating mask formed on the obverse surface side after the formation of the etching resist film on the reverse surface side of the leadframe material, so as to cause the internal connection terminal portions to project; a third step of electrically connecting the electrode pad portions of the semiconductor element and the internal connection terminal portions respectively corresponding thereto by a bonding wire after the semiconductor element is mounted on the leadframe material; a fourth step of encapsulating the obverse surface side of the leadframe material including the semiconductor element and the internal connection terminal portions; and a fifth step of performing etching treatment on the reverse surface side of the leadframe material with the etching resist film removed by using the formed plating mask as a resist mask, so as to cause the external connection terminal portions to project and to separate and make independent conductor terminals having the external connection terminal portions on an outer side and the internal connection terminal portions on an inner side, wherein a step of deburring and cleaning the plating is provided after the etching treatment in the second step and the fifth step, for removing plating burrs generated around a periphery of each of the internal connection terminal portions and the external connection terminal portions.

The etching resist film formed on the reverse surface side of the leadframe material may be one with a tape material adhered thereto, and may be removed by being peeled off after etching.

The deburring and cleaning of the plating referred to herein includes, for instance, cases where the plating burrs generated by etching are separated from the periphery of the surface of the respective inner connection terminal portion by applying ultrasonic waves during cleaning; cases where the plating burrs are removed by spraying water jets onto them; cases where the plating burrs are mechanically removed with a brush or the like, and the separated plating burrs are subsequently removed; cases where the intermediate product (i.e., the product immediately after half etching) is immersed in a water tank having an ultrasonic transducer to exfoliate the plating burrs, and washing is subsequently carried out; or a combination of these cases.

In the method of manufacturing a semiconductor device in accordance with the invention, the internal connection terminal portions of the conductor terminals may be constituted by wire bonding portions, and may be arranged around the semiconductor element with a gap provided with respect to each other.

In addition, in the method of manufacturing a semiconductor device in accordance with the invention, an element mounting portion for mounting the semiconductor element may be formed in a center of the leadframe material separately from the conductor terminals, the plating mask may be formed also on an obverse surface and a reverse surface of the element mounting portion in the first step, and the plating burrs generated may be removed in the step of deburring and cleaning the plating after the etching treatment in the second step and the fifth step.

In addition, in the method of manufacturing a semiconductor device in accordance with the invention, terminals for heat dissipation for mounting the semiconductor element thereon may be formed in a form of a grid array in a center of the leadframe material separately from the conductor terminals, the plating mask may be formed also on obverse surfaces and reverse surfaces of the terminals for heat dissipation in the first step, and the plating burrs generated may be removed in the step of deburring and cleaning the plating after the etching treatment in the second step and the fifth step.

Furthermore, in the method of manufacturing a semiconductor device in accordance with the invention, the semiconductor device may be constituted by a flip-chip type semiconductor device, and the internal connection terminal portions of the conductor terminals may be connected to the electrode pad portions disposed on a lower portion of the semiconductor element.

In the method of manufacturing a semiconductor device according to any one of the first to third aspects of the invention, since base metal plating or noble metal plating exhibiting etching solution resistance is provided as the lowermost layer of the plating mask, the generation of the plating burrs is maximally suppressed, and the deburring operation is not required. As a result, it is possible to provide a method of manufacturing a semiconductor device in which the fraction defective is low.

In addition, in the semiconductor device according to the fourth or fifth aspect of the invention, the connection terminal portions which are electrically connected to the electrode pad portions of the semiconductor element and the external connection terminal portions have their uppermost layers each constituted by a noble metal plating layer and their lowermost layers each constituted by base metal plating or noble metal plating exhibiting etching solution resistance. Therefore, it is possible to provide a semiconductor device in which the thickness of the plating is ensured, and the rate of defective products is low.

In the method of manufacturing a semiconductor device according to the fifth aspect of the invention, since the burrs around the periphery of the plating mask which are generated after the (half) etching treatment are removed, it is possible to provide a method of manufacturing a semiconductor device in which the fraction defective is low.

In addition, since special plating is not carried out in the formation of the plating mask, the cost of manufacturing semiconductor devices becomes low.

DESCRIPTION OF REFERENCE NUMERALS AND SIGNS

10: leadframe material, 11: resist film, 12: etching pattern, 13, 14: plating masks, 15: etching resist film, 16: element mounting portion, 17: wire bonding portion, 18: semiconductor element, 20: bonding wire, 21: encapsulating resin, 22: external connection terminal portion, 23: semiconductor device, 24: Ni undercoat, 25: noble metal plating, 26: plating burr, 28: semiconductor device, 29: semiconductor element, 30: electrode pad portion, 32: copper conductor, 33: gold plating, 34: undercoat, 35: gold plating, 36: substrate, 38, 39: plating masks, 40, 42: semiconductor device, 43: semiconductor element, 44: electrode pad portion, 45: semiconductor device

DESCRIPTION OF THE PREFERRED EMBODIMENTS

Referring now to the accompanying drawings, a description will be given of the embodiments of the invention to facilitate an understanding of the invention.

Figure 1:
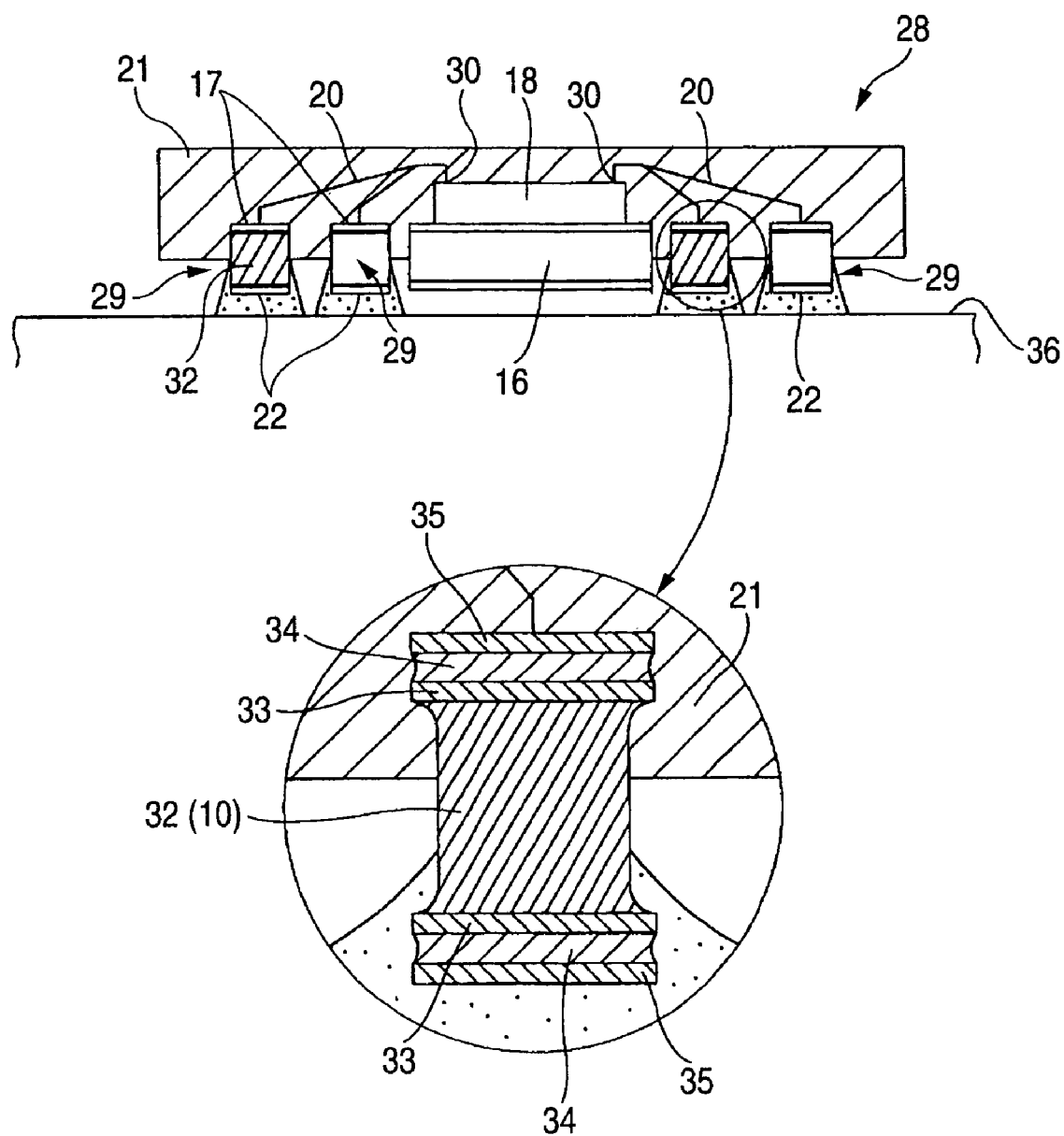
FIG. 1 is an explanatory diagram of a semiconductor device in accordance with a first embodiment of the invention.
Figure 2:
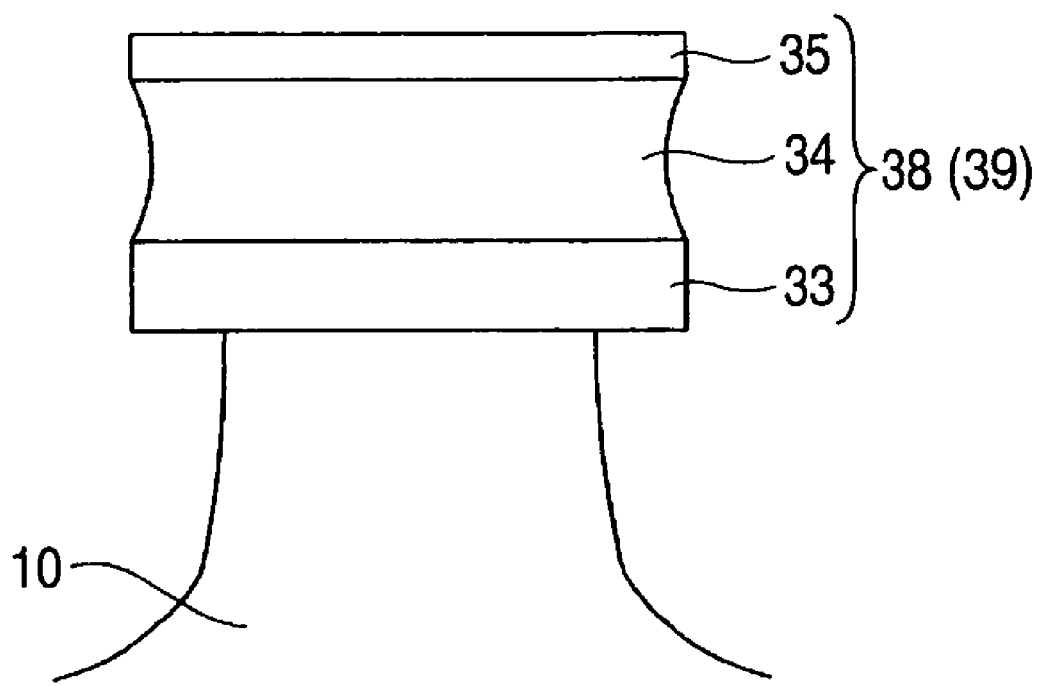
FIG. 2 is a cross-sectional view illustrating the details of a wire bonding portion.
Figure 3A:
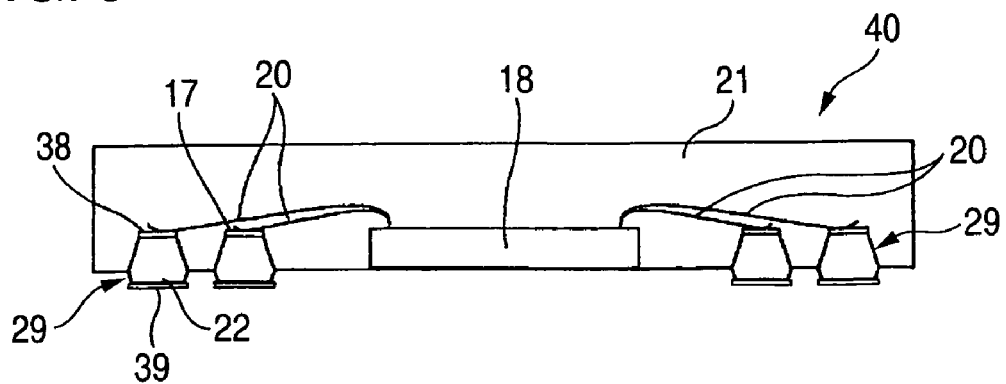
FIGS. 3A to 3C are explanatory diagram of a semiconductor device to which the first embodiment is applied.
Figure 3B:
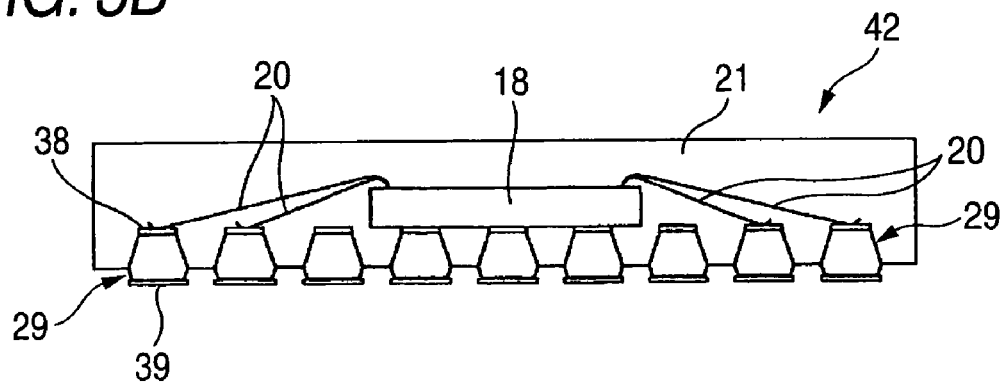
Figure 3C:
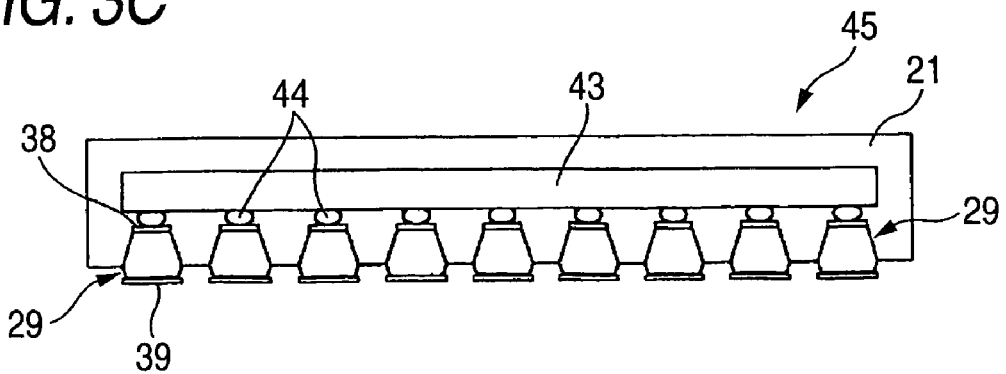

Here, FIG. 1 is an explanatory diagram of a semiconductor device manufactured by the method of manufacturing a semiconductor device in accordance with a first embodiment of the invention. FIG. 2 is a cross-sectional view illustrating the details of a wire bonding portion in accordance with the first embodiment of the invention. FIGS. 3A to 3C are explanatory diagrams of the semiconductor device to which the method of manufacturing a semiconductor device in accordance with the first embodiment of the invention is applied.

First, a description will be given of a semiconductor device 28 shown in FIG. 1. Those constituent elements which are identical to those of the semiconductor device shown in FIGS. 7A to 7J and its manufacturing method are denoted by the same reference numerals, and a detailed description thereof will be omitted.

As shown in FIG. 1, the semiconductor device 28 in accordance with the first embodiment of the invention has in its center a semiconductor element 18 and has in its periphery conductor terminals 29 whose upper surface sides (obverse surface sides) are formed as wire bonding portions 17 and whose lower surface sides (reverse surface sides) are formed as external connection terminal portions 22, the wire bonding portions 17 and the external connection terminal portions 22 being arranged in the form of area arrays. The wire bonding portions 17 and electrode pad portions 30 of the semiconductor element 18 are electrically connected by bonding wires 20, and upper halves of the semiconductor element 18, the bonding wires 20, and the conductor terminals 29 are resin encapsulated by an encapsulating resin 21.

The details of the conductor terminal 29 are shown in FIG. 1. A gold plating 33 with a thickness of 0.15 to 0.5 μm, which is one example of noble metal plating exhibiting etching solution resistance, is first provided on upper and lower sides of a rod-like copper conductor 32 which is formed by subjecting a leadframe material 10 (see FIG. 7A) to etching. An undercoat 34 with a thickness of 0.5 to 2 μm or thereabouts is provided thereon, and a gold plating 35 with a thickness of 0.15 to 0.5 μm, which is one example of the noble metal plating, is further provided thereon. In this embodiment, Ni plating is provided as the undercoat 34. It should be noted that the thickness of the leadframe material 10 is 0.1 to 0.3 μm or thereabouts, but the invention is not limited to this thickness.

An element mounting portion 16 in terms of its structure is provided with the plating of the same structure as the conductor terminal 29. Lower halves of the element mounting portion 16 and the conductor terminals 29 project from the encapsulating resin 21 and are exposed to the outside. Plating with excellent wettability is provided on a lower portion of each external connection terminal portion 22, and electrical connection is established with another substrate 36 by the fusion of cream solder provided on the other substrate 36, as shown in FIG. 1.

The element mounting portion 16 is disposed on the bottom surface side of the semiconductor element 18, thereby promoting heat dissipation from the semiconductor element 18.

Figure 7A:
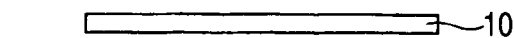
FIGS. 7A to 7J are explanatory diagrams of the method of manufacturing a semiconductor device in accordance with the invention.
Figure 7B:
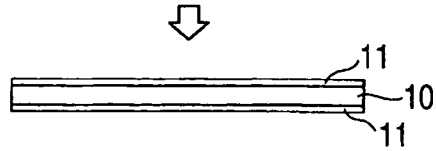
Figure 7C:
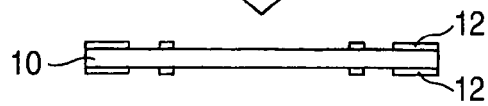
Figure 7D:
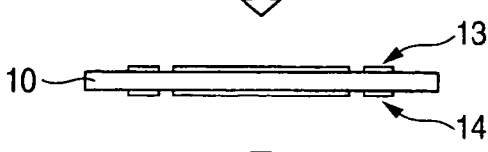

Next, a description will be given of the method of manufacturing this semiconductor device 28 as shown in FIGS. 7A to 7J. In FIGS. 7A to 7J, the steps of FIGS. 7A to 7C, described above, are the same. In the step of FIG. 7D, in the case where all-over plating is performed, the gold plating 33 with a thickness of 0.15 to 0.5 μm, which is one example of the noble metal plating, is first performed, and the undercoat 34 with a thickness of 0.5 to 2 μm or thereabouts is provided thereon. Then, the gold plating 35 with a thickness of 0.15 to 0.5 μm, which is one example of the noble metal plating, is further provided thereon.

Figure 7E:
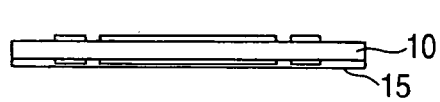
Figure 7F:
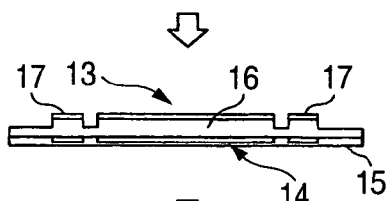

Next, as shown in FIG. 7E, the entire lower surface side of the leadframe material 10 is covered with an etching resist film 15, and half etching of the obverse side is performed, as shown in FIG. 7F. In this case, since the gold plating 33 and 35 is not eroded by the etching solution, the wire bonding portions 17 are formed, as shown in FIG. 2. Namely, the leadframe material 10 on the lower side is subjected to etching into a predetermined shape, and the leadframe material 10 is eroded up to a lower portion of the periphery of a plating mask 38 consisting of the gold plating 35, the undercoat 34, and the gold plating 33. Accordingly, the plating mask 38 projects from the periphery of the copper material constituting the wire bonding portion 17, but since its thickness has the thicknesses of the gold plating 33 and 35 and the undercoat 34, the plating mask 38 is difficult to bend, and does not constitute plating burrs formed by such being removed or coming off during the resin encapsulation. Accordingly, the defective rate of the semiconductor device 28 declines appreciably.

It should be noted that, according to the invention, as the etching resist film used in the step of FIG. 7E, one with a tape material adhered thereto is preferable, and the peeling operation after the etching is thereby facilitated. Step 7E is not performed in the noted prior art, as described in the BACKGROUND OF THE INVENTION, above.

Figure 7G:
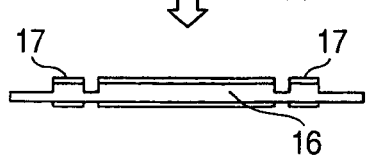
Figure 7H:
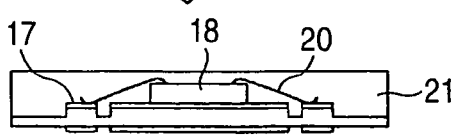

Subsequently, as shown in FIG. 7G, the resist film 15 on the lower surface side is removed. After the semiconductor element 18 is mounted on the element mounting portion 16, the electrical connection between the semiconductor element 18 and the wire bonding portions 17 is effected by the bonding wire 20, and the upper side of the leadframe material 10 is resin encapsulated (FIG. 7H).

Figure 7I:
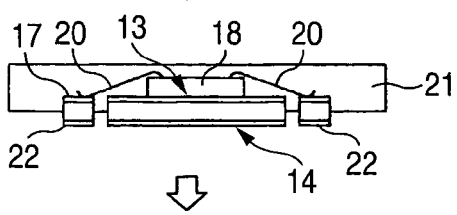

Then, as shown in FIG. 7I, half etching of the reverse surface side of the leadframe material 10 is carried out. In this case as well, since the reverse surface sides of the external connection terminal portions 22 and the element mounting portion 16 are covered by a plating mask 39 consisting of the gold plating 35, the undercoat 34, and the gold plating 33, the plating mask 39 formed with a relatively large thickness as a whole is not eroded by an etching solution. In addition, since the plating mask 39 has a fixed thickness (preferably 1 to 10 μm, more preferably 1.5 to 4 μm), plating burrs are not formed.

Figure 7J:
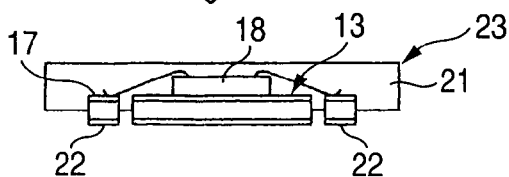
Figure 8:
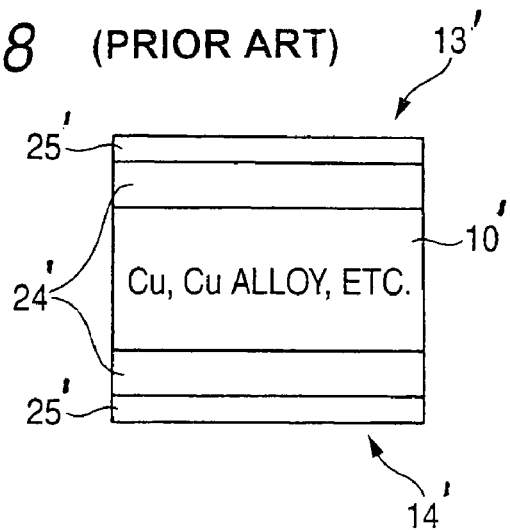
FIG. 8 is an explanatory diagram of a conventional plating mask as known to be used in a manufacturing method as generally shown in FIGS. 7A-7J.
Figure 9A:
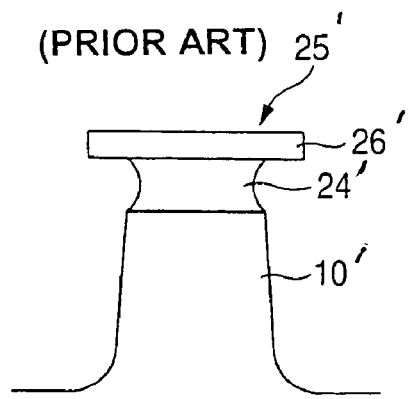
FIGS. 9A and 9B are explanatory diagrams illustrating the situation of generation of plating burrs resulting from use of the plating masks in FIG. 8 and using the general method shown in FIGS. 7A-7J.
Figure 9B:
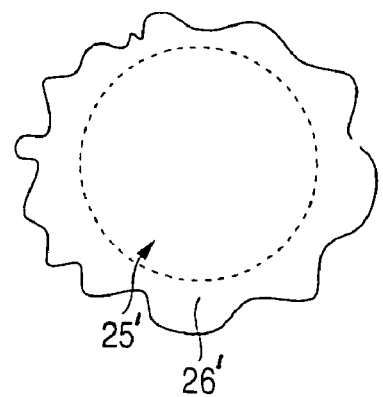

Next, as shown in FIG. 7J, each semiconductor device 28 is cut and separated to obtain individual semiconductor devices.

Next, referring to FIGS. 3A to 3C, a description will be given of semiconductor devices 40, 42, and 45 to which the method of manufacturing a semiconductor device in accordance with the invention is applied.

FIG. 3A shows a semiconductor device 40 in which the element mounting portion (die pad) is omitted, a clearance is provided around the periphery of the semiconductor element 18, and the conductor terminals 29 are arranged in the form of a grid array. The upper sides of these conductor terminals 29 are formed as the wire bonding portions 17, and the lower sides thereof are formed as the external connection terminal portions 22. The plating masks 38 and 39 each consisting of the gold plating 35, the undercoat 34, and the gold plating 33 are respectively formed on the surfaces of the wire bonding portions 17 and the external connection terminal portions 22.

Since the surface area of each of these plating masks 38 and 39 is larger than the cross-sectional area of the copper conductor 32, the electrically jointing efficiency improves. It should be noted that the masks 38 shown in FIGS. 3A to 3C bulge outwardly, as shown in the enlarged view in FIG. 1.

Next, FIG. 3B shows a semiconductor device in which the element mounting portion is omitted, and instead the plurality of conductor terminals 29 (terminals for heat dissipation) are provided immediately below the semiconductor element 18. The conductor terminals 29 disposed immediately below the semiconductor element 18 do not form conductive circuits, but assist the heat dissipation from the semiconductor element 18.

The plating masks 38 and 39 each consisting of the gold plating 35, the undercoat 34, and the gold plating 33 are respectively formed on the upper and lower surfaces of the conductor terminals 29, thereby preventing the generation of plating burrs.

The semiconductor device 45 shown in FIG. 3C, is a flip-chip (FC) type semiconductor device in which electrode pad portions 44 of a semiconductor element 43 are arranged in the form of a grid array, the semiconductor element 43 is disposed with the electrode pad portions 44 facing downward, and internal connection terminal portions are respectively provided on the upper sides of the conductor terminals 29, and are directly joined to the electrode pad portions 44 of the semiconductor element 43. As a result, the semiconductor device can be made further compact.

In this case as well, the plating masks 38 and 39 each consisting of the gold plating 35, the undercoat 34, and the gold plating 33 are respectively formed on the upper and lower surfaces of the conductor terminals 29, thereby preventing the generation of plating burrs.

In the above-described embodiment, each of the plating masks 38 and 39 is formed such that noble metal plating is provided as the lowermost layer and the uppermost layer, and Ni plating acting as an undercoat is provided as the intermediate portion; however, the noble metal plating in the lowermost layer may be omitted, and the undercoat may be base metal plating with a large thickness. In this case, any metal may be used as the base metal plating insofar as the metal is not eroded by the etching solution, but it is preferable to use such as tin plating, tin-bismuth plating, leaded solder plating, or lead-free solder plating exhibiting etching solution resistance. Since these metals are unlikely to be eroded by the etching solution, and the thin noble metal plating on the surface does not form burrs. It should be noted that such base metal plating is sufficient if it is far less (e.g., the etching rate is 1/10 or less) difficult to be eroded by the etching solution than Ni plating, and even it is eroded to some extent, the erosion can be compensated for by increasing its thickness (e.g., 4 to 8 μm).

Figure 4:
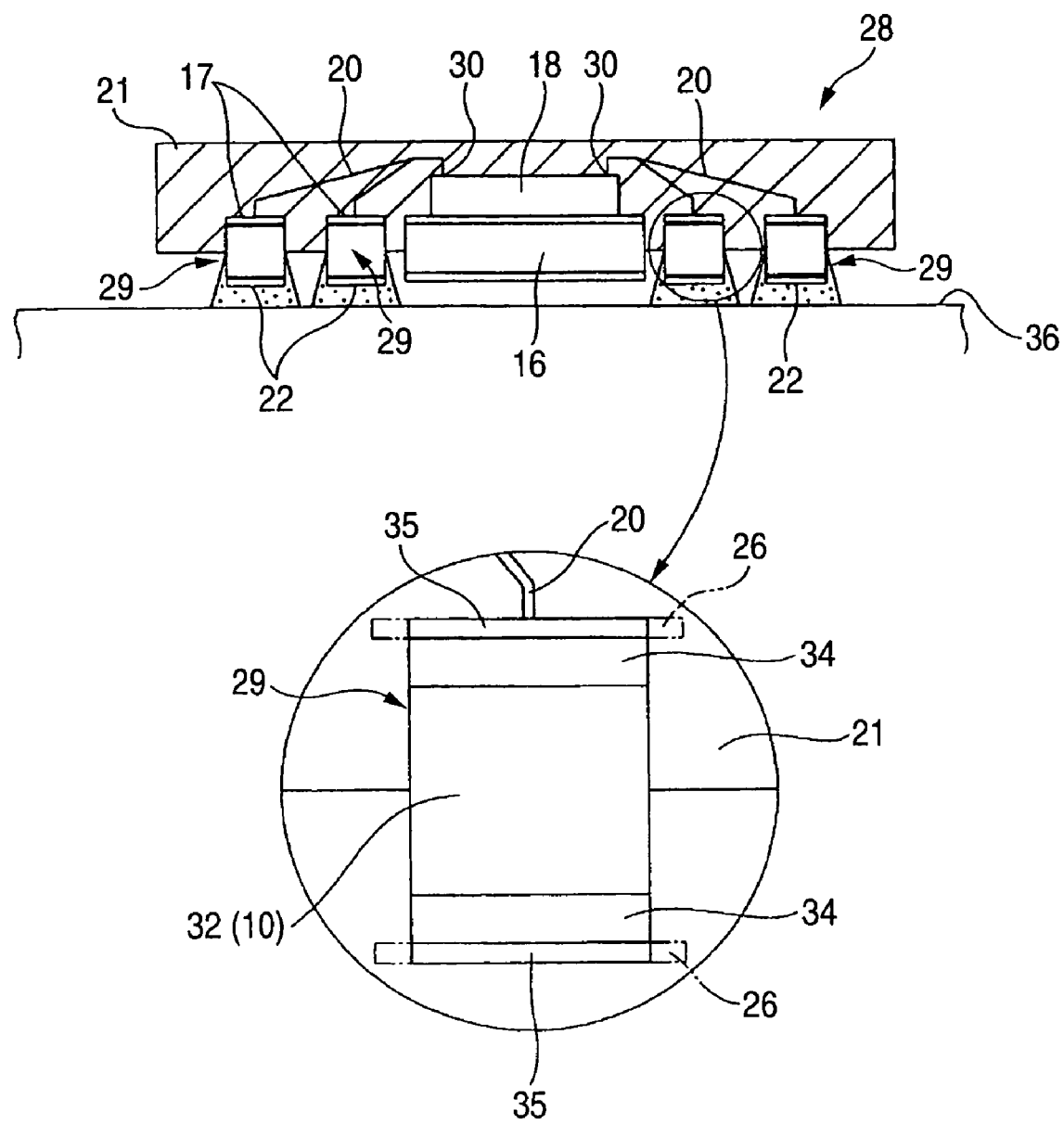
FIG. 4 is an explanatory diagram of a semiconductor device in accordance with a second embodiment of the invention.
Figure 5:
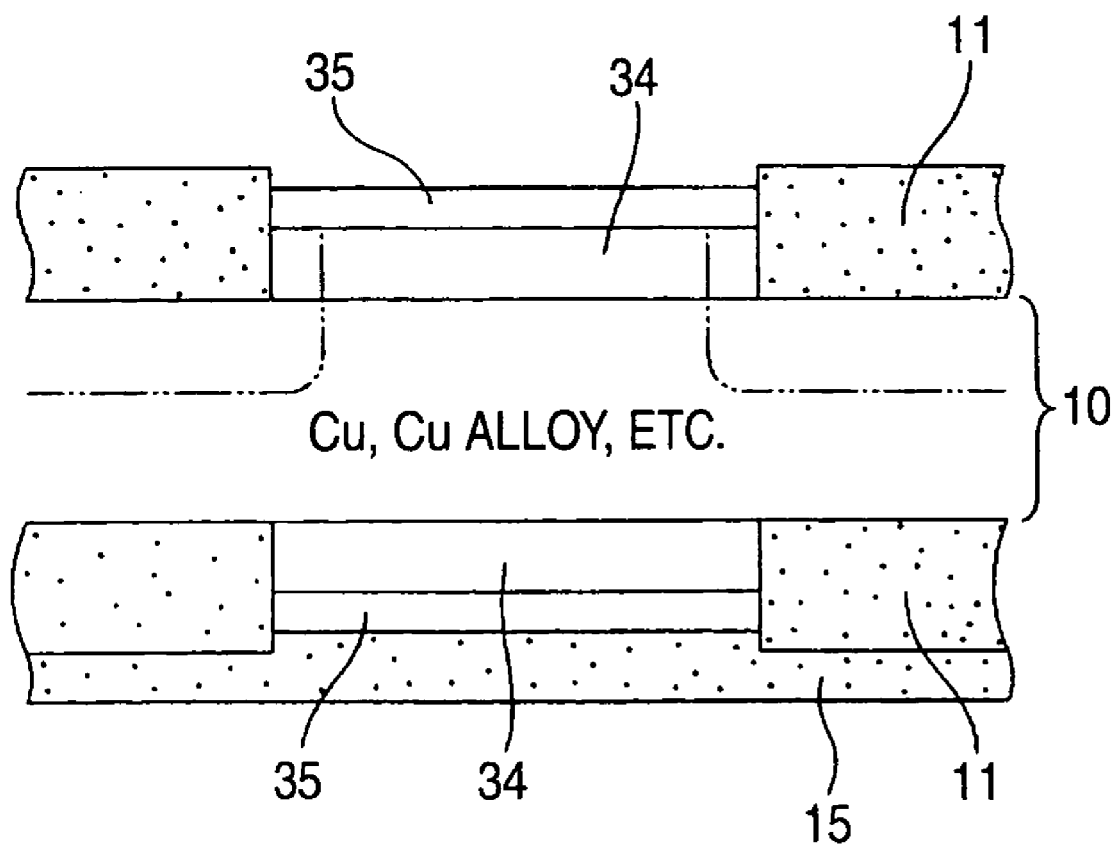
FIG. 5 is a cross-sectional view illustrating the details of the wire bonding portion.
Figure 6A:
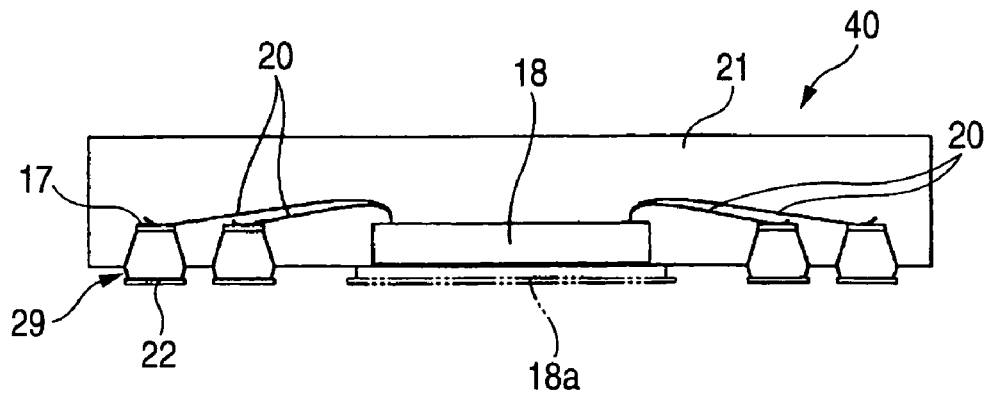
FIGS. 6A to 6C are explanatory diagram of a semiconductor device to which the second embodiment is applied.
Figure 6B:
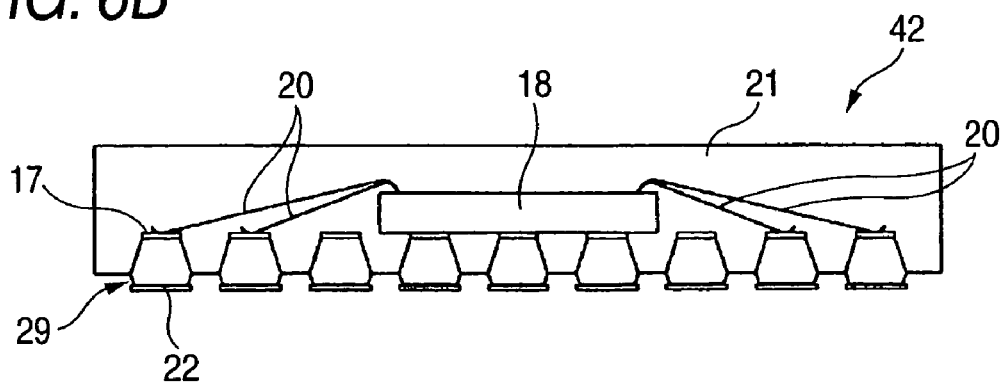
Figure 6C:
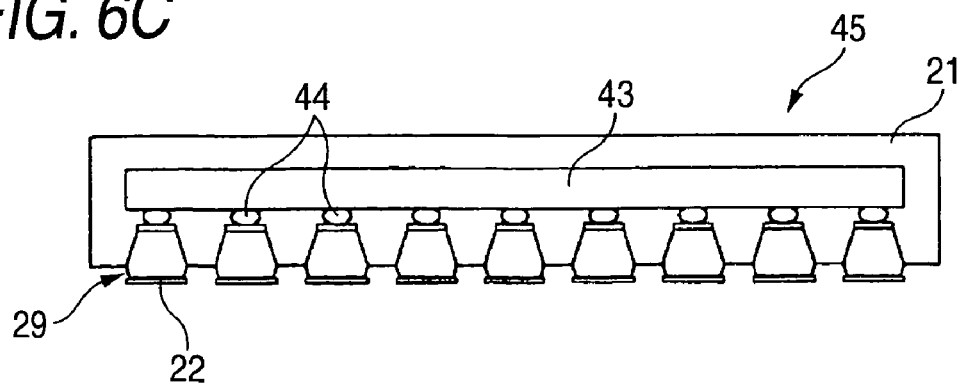

Next, FIG. 4 is an explanatory diagram of a semiconductor device manufactured by the method of manufacturing a semiconductor device in accordance with a second embodiment of the invention. FIG. 5 is a cross-sectional view illustrating the details of a wire bonding portion in accordance with the second embodiment of the invention. FIGS. 6A to 6C are explanatory diagrams of the semiconductor device to which the method of manufacturing a semiconductor device in accordance with the second embodiment of the invention is applied.

First, a description will be given of the semiconductor device 28 shown in FIG. 4 and manufactured by the method of manufacturing a semiconductor device in accordance with the second embodiment of the invention. Those constituent elements which are identical to those of the method of manufacturing the semiconductor device shown in FIG. 1 are denoted by the same reference numerals, and a detailed description thereof will be omitted.

As shown in FIG. 4, the semiconductor device 28 manufactured by the method of manufacturing a semiconductor device in accordance with the second embodiment of the invention has in its center a semiconductor element 18 and has in its periphery the conductor terminals 29 whose upper surface sides (obverse surface sides) are formed as wire bonding portions 17, i.e., one example of the internal connection terminal portions, and whose lower surface sides (reverse surface sides) are formed as the external connection terminal portions 22, the wire bonding portions 17 and the external connection terminal portions 22 being arranged in the form of area arrays. The wire bonding portions 17 and the electrode pad portions 30 of the semiconductor element 18 are electrically connected by the bonding wires 20, and upper halves of the semiconductor element 18, the bonding wires 20, and the conductor terminals 29 are resin encapsulated by the encapsulating resin 21.

The details of the conductor terminal 29 are shown in FIG. 4. The undercoat 34 with a thickness of 0.5 to 2 μm or thereabouts is first provided on the upper and lower sides of the rod-like copper conductor 32 which is formed by subjecting the leadframe material 10 (see FIG. 4) to etching, and the gold plating 35 with a thickness of 0.15 to 0.5 μm, which is one example of the noble metal plating, is further provided thereon. In this embodiment, Ni plating is provided as the undercoat 34. It should be noted that the thickness of the leadframe material 10 is 0.1 to 0.3 μm or thereabouts, but the invention is not limited to this thickness. The thickness of this gold plating 35 is not limited insofar as it has such a thickness that the substrate is not eroded by the etching solution; however, if the gold plating 35 becomes too thick, the manufacturing cost unfavorably soars. The conductor terminals 29 (and also the element mounting portion 16 which will be described below) are formed by etching, and the width of the aforementioned undercoat 34 and gold plating 35 formed on the upper and lower sides of the copper conductor 32 is substantially identical to that of the cross section of the copper conductor 32 since its peripheral burrs 26 have been removed.

The element mounting portion 16 in terms of its structure is provided with the plating of the same structure as the conductor terminal 29. Lower halves of the element mounting portion 16 and the conductor terminals 29 project from the encapsulating resin 21 and are exposed to the outside. Plating with excellent wettability is provided on the lower portion of each external connection terminal portion 22, and electrical connection is established with the other substrate 36 by the fusion of cream solder provided on the other substrate 36, as shown in FIG. 4.

The element mounting portion 16 is disposed on the bottom surface side of the semiconductor element 18, thereby promoting heat dissipation from the semiconductor element 18.

Next, a description will be given of the method of manufacturing this semiconductor device 28 In FIGS. 7A to 7J, the steps of FIGS. 7A to 7C are the same as previously described. In the step of FIG. 7D, in the case where all-over plating is performed, the undercoat 34 with a thickness of 0.5 to 2 μm or thereabouts is first provided, as shown in FIG. 5. Then, the gold plating 35 with a thickness of 0.15 to 0.5 μm, which is one example of the noble metal plating, is further provided thereon.

Next, as shown in FIG. 7E, the entire lower surface side of the leadframe material 10 is covered with the etching resist film 15, and half etching of the obverse side is performed, as shown in FIG. 7F. In this case, although part of the leadframe material 10 and part of the undercoat 34 are eroded by the etching solution, since the gold plating 35 is not eroded by the etching solution, the wire bonding portions 17 are formed, as shown in FIG. 5. Namely, the leadframe material 10 is subjected to etching into a predetermined shape to form an upper half of the copper conductor 32, and part of the undercoat 34 is also eroded concurrently. Then, the gold plating 35 at the uppermost portion remains, and the plating burrs 26 are formed around the periphery immediately above the copper conductor 32. If the plating burrs 26 are left as they are, a product defective of the semiconductor device results, as described before.

Accordingly, the step of deburring and cleaning the plating is provided after this half etching step (F). This deburring of the plating is effected by, for example, applying to the burrs 26 a cleaning solution with ultrasonic waves added thereto. In addition, the deburring of the plating can also be effected by mechanical deburring by rubbing with a brush or the like or by water jets or the like, or can be effected by chemical treatment with such as aqua regia. Since the plating burrs melt from both upper and lower sides, and a necessary portion (e.g., the wire bonding portion) melts only from one side alone, so that the plating burrs can be removed. Subsequently, the removed plating burrs are completely removed from the product by cleaning. It should be noted that, after the half etching steps (F) and (I), washing is naturally carried out to remove the etching solution, and is effected at a timing different from this step of deburring and cleaning the plating.

It should be noted that, as the etching resist film used in the half etching step (F), one with a tape material adhered thereto is preferable, and the peeling operation after the etching is thereby facilitated.

After the removal of the plating burrs 26, the resist film 15 on the lower surface side is removed. After the semiconductor element 18 is mounted on the element mounting portion 16, the electrical connection between the semiconductor element 18 and the wire bonding portions 17 is effected by the bonding wire 20, and the upper side of the leadframe material 10 is resin encapsulated (FIG. 7H). Then, as shown in FIG. 7I, half etching of the reverse surface side of the leadframe material 10 is carried out. In this case as well, since the reverse surface sides of the external connection terminal portions 22 and the element mounting portion 16 are provided with the undercoat 34 and the gold plating 35, the plating burrs 26 are generated, so that the above-described step of deburring and cleaning the plating is carried out to remove all the formed plating burrs 26.

Next, as shown in FIG. 7J, each semiconductor device 28 is cut and separated to obtain individual semiconductor devices.

Next, referring to FIGS. 6A to 6C, a description will be given of the semiconductor devices 40, 42, and 45 to which the method of manufacturing a semiconductor device in accordance with the second embodiment of the invention is applied. It should be noted that, in the manufacturing method described below, the above-described step of deburring and cleaning the plating is provided after the respective half etching treatment so as to remove the plating burrs 26 formed by the half etching treatment.

FIG. 6A shows the semiconductor device 40 in which the element mounting portion (die pad) is omitted, a clearance is provided around the periphery of the semiconductor element 18, and the conductor terminals 29 are arranged in the form of a grid array. The upper sides of these conductor terminals 29 are formed as the wire bonding portions 17, and the lower sides thereof are formed as the external connection terminal portions 22. The undercoat 34 and the gold plating 35 are formed on the surfaces of the wire bonding portions 17 and the external connection terminal portions 22, respectively (see FIG. 1). Although the plating burrs 26 were formed around the periphery of the gold plating 35, the plating burrs 26 are removed in the step of deburring and cleaning the plating.

It should be noted that it is also possible to provide a die pad 18a on the bottom of the semiconductor element 18, as shown by the two-dot chain line in FIG. 6A. This die pad 18a can be half etching, as described before, or may be adhered to the bottom of the semiconductor element 18.

Next, FIG. 6B shows the semiconductor device in which the element mounting portion is omitted, and instead the plurality of conductor terminals 29 are provided immediately below the semiconductor element 18 in the form of a grid array. The conductor terminals 29 disposed immediately below the semiconductor element 18 do not form conductive circuits, but assist the heat dissipation from the semiconductor element 18 (terminals for heat dissipation). It should be noted that the wire bonding portions 17 are respectively formed on the upper surfaces of the conductor terminals 29 provided around the periphery of the semiconductor element 18, and the external connection terminal portions 22 are formed on the lower surfaces thereof.

Plating masks 13 and 14 each consisting of the undercoat 34 and the gold plating 35 are respectively provided on the upper and lower surfaces of the respective conductor terminals 29, and the plating burrs formed in the half etching treatment are removed.

The semiconductor device 45 shown in FIG. 6C, is the flip-chip (FC) type semiconductor device in which the electrode pad portions 44 of the semiconductor element 43 are arranged in the form of a grid array, the semiconductor element 43 is disposed with the electrode pad portions 44 facing downward, and the internal connection terminal portions are respectively provided on the upper sides of the conductor terminals 29, and are directly joined to the electrode pad portions 44 of the semiconductor element 43. As a result, the semiconductor device can be made further compact.

In this case as well, the undercoat 34 and the gold plating 35 are provided on the upper and lower surfaces of the respective conductor terminals 29, and the plating burrs formed in the half etching treatment are removed.

Although the gold plating is used as one example of the noble metal plating, other metals (e.g., Ag, Pd, Pt, etc.) can also be used in the invention insofar as the metals are generally not eroded or difficult to be eroded by the etching solution, and are difficult to undergo surface oxidation.

What is claimed is:

1. A method of manufacturing a semiconductor device, comprising:

a first step of forming a plating mask having a noble metal plating layer as an uppermost layer, formed by performing noble metal plating on an undercoat, on internal connection terminal portions which are electrically connected to electrode pad portions of a semiconductor element mounted on an obverse surface side of a leadframe material and on external connection terminal portions formed on a reverse surface side of the leadframe material in correspondence with the internal connection terminal portions;

a second step of performing etching treatment of a predetermined depth on the leadframe material from the obverse surface side by using the plating mask as a resist mask formed on the obverse surface side after the formation of an etching resist film on the reverse surface side of the leadframe material, so as to cause the internal connection terminal portions to project;

a third step of electrically connecting the electrode pad portions of the semiconductor element and the internal connection terminal portions respectively corresponding thereto by a bonding wire after the semiconductor element is mounted on the leadframe material;

a fourth step of encapsulating the obverse surface side of the leadframe material including the semiconductor element and the internal connection terminal portions; and a fifth step of performing etching treatment on the reverse surface side of the leadframe material with the etching resist film removed by using the formed plating mask as a resist mask, so as to cause the external connection terminal portions to project and to separate and make independent conductor terminals having the external connection terminal portions and the internal connection terminal portions, wherein there is performed a step of removing plating burrs generated around a periphery of the noble metal plating layer with a shape of a foil of the noble metal plating by eroding the undercoat in the etching treatment.

2. The method of manufacturing a semiconductor device according to claim 1, wherein the etching resist film formed on the reverse surface side of the leadframe material is one with a tape material adhered thereto, and is removed by being peeled off after etching.

3. The method of manufacturing a semiconductor device according to claim 1, wherein the internal connection terminal portions of the conductor terminals are constituted by wire bonding portions, and are arranged around the semiconductor element with a gap provided with respect to each other.

4. The method of manufacturing a semiconductor device according to claim 2, wherein an element mounting portion for mounting the semiconductor element is formed in a center of the leadframe material separately from the conductor terminals, the plating mask is formed also on an obverse surface and a reverse surface of the element mounting portion in the first step, and the plating burrs generated are removed in the step of deburring and cleaning the plating after the etching treatment in the second step and the fifth step.

5. The method of manufacturing a semiconductor device according to claim 2, wherein terminals for heat dissipation for mounting the semiconductor element thereon are formed in a form of a grid array in a center of the leadframe material separately from the conductor terminals, the plating mask is formed also on obverse surfaces and reverse surfaces of the terminals for heat dissipation in the first step, and the plating burrs generated are removed in the step of deburring and cleaning the plating after the etching treatment in the second step and the fifth step.

6. The method of manufacturing a semiconductor device according to claim 1, wherein the semiconductor device is constituted by a flip-chip type semiconductor device, and the internal connection terminal portions of the conductor terminals are connected to the electrode pad portions disposed on a lower portion of the semiconductor element.

7. The method of manufacturing a semiconductor device according to claim 1 wherein the first step comprises forming a plating mask having spaced noble metal plating layers both on a same one of the sides of the leadframe material.

8. The method of manufacturing a semiconductor device according to claim 1, wherein an element mounting portion is formed in a center of the leadframe material independently of the external connection terminal portions.

9. The method of manufacturing a semiconductor device according to claim 1, wherein a terminal for heat dissipation is provided immediately below the semiconductor element.

10. A semiconductor device manufactured by the method of manufacturing a semiconductor device according to claim 1.

11. The method of manufacturing a semiconductor device according to claim 1, wherein the step of removing the plating burrs is performed after the etching treatment in the second step.

12. The method of manufacturing a semiconductor device according to claim 1, wherein the step of removing the plating burrs is performed after the etching treatment in the fifth step.

13. The method of manufacturing a semiconductor device according to claim 1, wherein the step of removing the plating burrs is performed after the etching treatments in the second step and the fifth step.

14. The method of manufacturing a semiconductor device according to claim 1, wherein the step of performing etching treatment comprises performing etching treatment through erosion by an etching solution.

15. A method of manufacturing a semiconductor device, comprising:

a step of forming a leadframe material by performing etching treatment of a predetermined depth on the leadframe material from an obverse surface side thereof so that an internal connection terminal portion on which a plating layer is formed, by performing noble metal plating on an undercoat, as an uppermost layer projects, and an external connection terminal portion on which a plating layer is formed as an uppermost layer projects on a reverse side of the leadframe material;

a step of encapsulating with resin the obverse surface side of the leadframe material including an electrode pad portion of a semiconductor element and the internal connection terminal portion after mounting the semiconductor element of the leadframe material; and a step of performing etching treatment on the reverse surface side of the leadframe material by using the formed plating mask as a resist mask, so as to cause the external connection terminal portions to project and to separate and make an independent conductor terminal having the external connection terminal portion and the internal connection terminal portion, wherein a step of removing plating burrs generated around a periphery of the noble metal plating layer on the external connection terminal with a shape of a foil of the noble metal plating by eroding the undercoat in the etching treatment is conducted after the etching treatment in which the external connection terminal is caused to project.

16. The method of manufacturing a semiconductor device according to claim 15, wherein the step of performing etching treatment comprises performing etching treatment through erosion by an etching solution.

* * * * *